United States Patent
Fukuda et al.

(10) Patent No.: US 8,474,396 B2
(45) Date of Patent: Jul. 2, 2013

(54) DEVELOPING APPARATUS, RESIST PATTERN FORMING METHOD AND STORAGE MEDIUM

(75) Inventors: Masahiro Fukuda, Kumamoto (JP); Atsushi Ookouchi, Kumamoto (JP); Taro Yamamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 186 days.

(21) Appl. No.: 12/836,137

(22) Filed: Jul. 14, 2010

(65) Prior Publication Data

US 2011/0014379 A1    Jan. 20, 2011

(30) Foreign Application Priority Data

Jul. 17, 2009   (JP) .................................. 2009-169539

(51) Int. Cl.
    *B05B 7/16*    (2006.01)
(52) U.S. Cl.
    USPC ............................. 118/302; 118/320; 118/321
(58) Field of Classification Search
    USPC .......................................... 118/302, 320–321
    See application file for complete search history.

(56) References Cited

U.S. PATENT DOCUMENTS

2007/0184178 A1*   8/2007   Yamamoto et al. ........... 118/313

FOREIGN PATENT DOCUMENTS

| JP | 60-064351 A | 4/1985 |
| JP | 63-058449 A | 3/1988 |
| JP | 63-197951 A | 8/1988 |
| JP | 06-077124 A | 3/1994 |
| JP | 09-297404 A | 11/1997 |
| JP | 2005-210059 A | 8/2005 |
| JP | 2005-286231 A | 10/2005 |

* cited by examiner

*Primary Examiner* — Dah-Wei Yuan
*Assistant Examiner* — Stephen Kitt
(74) *Attorney, Agent, or Firm* — Abelman, Frayne & Schwab

(57) ABSTRACT

Provided is a developing apparatus configured to slim the resist pattern while reducing the number of developing modules. A room temperature developing liquid and a high temperature developing liquid to modify the surface layer of a resist pattern can be supplied from a common nozzle to a substrate disposed on a mount table. Although both developing liquids may be sequentially discharged by switching between the supply line for the room temperature developing liquid and the supply line for the high temperature developing liquid, it is also possible to join these supply lines for supplying the room temperature developing liquid from the former supply line, and then adjust the ratio of the flow rates between both supply lines, and then supply the mixed liquid of the developing liquids as a high temperature developing liquid.

9 Claims, 17 Drawing Sheets

FIG.7
(a) step S7
moving developing liquid nozzle
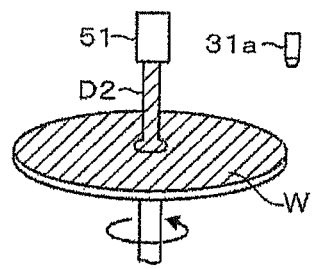
(b) step S8
discharging deionized water
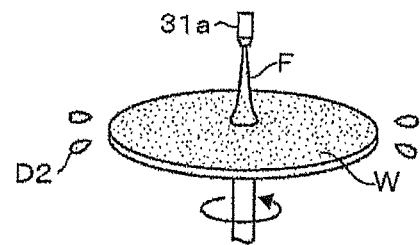

FIG.15
(a) 600ml
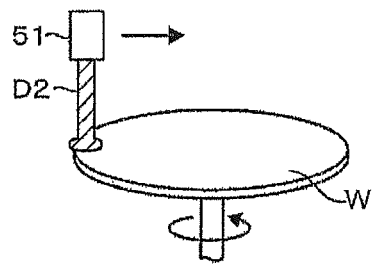
(b) 600ml
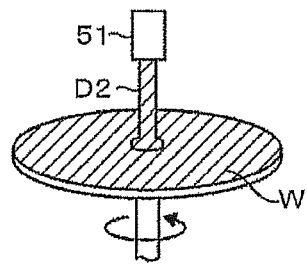
(c) 150ml
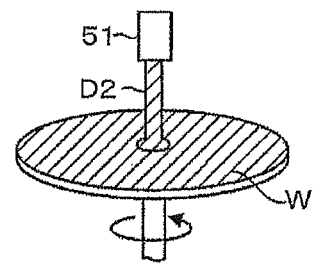
(d) 150ml
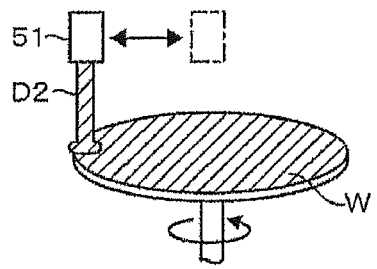

DEVELOPING APPARATUS, RESIST PATTERN FORMING METHOD AND STORAGE MEDIUM

This application is based on and claims priority from Japanese Patent Application No. 2009-169539, filed on Jul. 17, 2009, with the Japanese Patent Office, the disclosure of which is incorporated herein in its entirety by reference.

TECHNICAL FIELD

The present disclosure relates to a developing apparatus, a method for forming a resist pattern and a storage medium.

BACKGROUND

In a photoresist process as one of semiconductor manufacturing processes, resist has been applied to the surface of a semiconductor wafer (hereinafter, referred to as "wafer"), and exposed in a predetermined pattern and then, developed so as to form a resist pattern. These processes are generally performed using a system in which an exposing apparatus is connected to a resist applying and developing apparatus for applying and developing the resist.

The resist applying and developing apparatus includes a resist applying module to apply the resist on the wafer and a developing module to supply a developing liquid. In addition to these modules, the resist applying and developing apparatus further includes modules for heating and cooling configured to heat or cool the wafer before and after the processing of the wafer in the resist applying module and the developing module. And, the wafer is carried between these modules by a carrying means such as a carrying arm.

In this respect, it has been considered that a double patterning method is used to allow a feature size of the resist pattern to be finer. In summarizing the double patterning method, a first resist applying process, a first exposure process and a first developing process are performed in this order to form a first resist pattern on the wafer. And then, after a process protecting the shape of the first resist pattern is performed, the wafer is further subjected to a second resist applying process and a second exposure process. In the second exposure process, wafer W is exposed to an area deviated from the area exposed in the first exposure process. Thereafter, a second developing process is performed to form a second resist pattern.

Upon performing such a double patterning method, it has been considered that a slimming process is performed which allows a wall part of the resist pattern formed by each of the first and the second developing processes to be thinned and an aperture width of the resist pattern to become widened so as to achieve a desired pattern dimension. In this slimming process, after the resist pattern is formed, a developing liquid which is at a higher temperature than a room temperature developing liquid used in forming the resist pattern is supplied to the wafer so as to modify the surface layer of the pattern wall. Further, an acid containing chemical liquid is supplied to the wafer to be penetrated into the modified surface layer of the pattern wall, and then the room temperature developing liquid is supplied to the wafer to remove the modified surface.

On the other hand, in a conventional developing module for forming the resist pattern, the temperature of the developing liquid is regulated up to the entry of the module, so that the room temperature developing liquid can be supplied from a nozzle to the wafer. However, in such a conventional developing facility, it may be difficult to supply a high temperature developing liquid capable of performing the slimming process from the nozzle. Accordingly, being separated from the conventional developing module, it may be considered that a developing module to supply the high temperature developing liquid is provided in the applying and developing apparatus, and the wafer is transferred between these modules to be processed. However, since the number of the modules is increased and the carrying time of the wafer is also increased by doing so, the throughput of the wafer is decreased. Further, Japanese Patent Laid-open Publications No. 2005-210059 (e.g., paragraph 0040) and No. 2005-286231 (e.g., paragraph 0040 and FIG. 6) describe a developing apparatus capable of regulating the temperature of the developing liquid supplied to the wafer. However, the developing apparatus described in these Publications just aims to control the shape of the pattern in a normal developing process, but cannot perform the normal developing process and a process for modifying a surface of the pattern as mentioned above. Accordingly, these developing apparatus cannot overcome the above situation.

SUMMARY

According to an exemplary embodiment, there is provided an apparatus to develop a substrate formed with a resist film and exposed, by supplying a developing liquid to the substrate. The apparatus includes a mount table configured to mount the substrate horizontally, a first nozzle configured to supply a first developing liquid regulated in a first temperature to the surface of the substrate disposed on the mount table, a second nozzle configured to supply a second developing liquid regulated in a second temperature higher than the first temperature to the surface of the substrate disposed on the mount table, a control unit configured to output a control signal which allows the first nozzle to supply the first developing liquid on the surface of the substrate so as to develop the surface of the substrate and then allows the second nozzle to supply the second developing liquid on the surface of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 7a, 7b are process chart illustrating procedures of processes performed by the developing apparatus.

FIGS. 15a, 15b, 15c, 15d are process chart illustrating procedures of processes performed by the developing apparatus.

DETAILED DESCRIPTION

Figure 1:
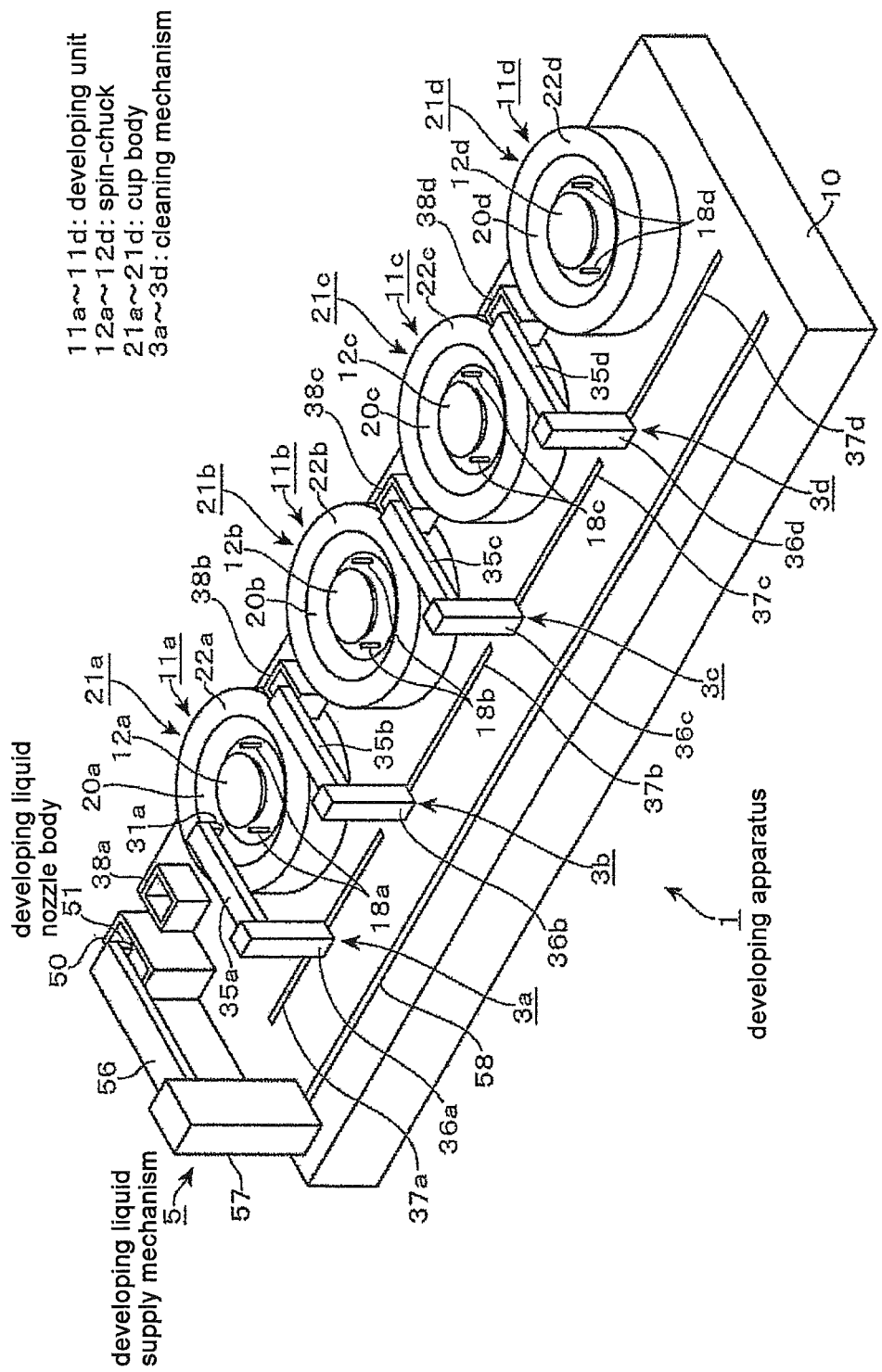
FIG. 1 is a perspective view illustrating a developing apparatus according to an embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure is developed in view of the above situation, and aims to provide a developing apparatus and a resist pattern forming method capable of allowing the resist pattern to be thinner and reducing the number of the module (the number of the developing apparatus), and a recording medium having a computer program capable of performing the resist pattern forming method.

According to an aspect of the present disclosure, there is provided an apparatus to develop a substrate formed with a resist film and then exposed, by supplying a developing liquid to the substrate. The apparatus includes a mount table configured to mount the substrate horizontally, a first nozzle configured to supply a first developing liquid regulated in a first temperature to the surface of the substrate disposed on the mount table, a second nozzle configured to supply a second developing liquid regulated in a second temperature higher than the first temperature to the surface of the substrate disposed on the mount table, a control unit configured to output a control signal which allows the first nozzle to supply the first developing liquid on the surface of the substrate so as to develop the surface of the substrate and then allows the second nozzle to supply the second developing liquid on the surface of the substrate.

The developing apparatus may include a cleaning nozzle configured to supply a liquid, such as a cleaning liquid on the surface of the substrate disposed on the mount table. Further, the control unit may output a control signal which allows the cleaning nozzle to supply the cleaning liquid to the surface of the substrate after the substrate is developed by the first developing liquid supplied from the first nozzle, and then allows the second nozzle to supply the second developing liquid to the surface of the substrate. Moreover, the developing apparatus may include a first supply line connected to the first nozzle and configured to flow the developing liquid therethrough while regulating the developing liquid in a first temperature and a second supply line connected to the second nozzle and configured to flow the developing liquid therethrough while regulating the developing liquid in a second temperature.

In addition, the developing apparatus may include a first supply line configured to flow the developing liquid therethrough while regulating the developing liquid in a predetermined temperature, a second supply line configured to flow the developing liquid therethrough while regulating the developing liquid in a temperature higher than the predetermined temperature, a join part at which the first supply line and the second supply line join, a flow rate regulating unit configured to regulate a flow ratio of the developing liquid between the first supply line and the second supply line, and a control unit which controls the flow rate regulating unit to regulate the temperature of the developing liquid into the second temperature so as to use the developing liquid at a downstream side of the join part as the second developing liquid when the second developing liquid is supplied to the surface of the substrate. In this case, for example, the predetermined temperature in the first supply line may be the first temperature, and the developing liquid flowing through the first supply line may be used as the first developing liquid.

The first nozzle and the second nozzle may share a nozzle body and a developing liquid discharge port formed in the nozzle body, and the first supply line and the second supply line may be connected to the developing liquid discharge port. The control unit may output a control signal to control the temperature of the developing liquid discharged from the developing liquid discharge port in the first temperature when the first developing liquid is supplied to the surface of the substrate, and to control the temperature of the developing liquid discharged from the developing liquid discharge port in the second temperature when the second developing liquid is supplied to the surface of the substrate.

Further, the first nozzle and the second nozzle may share a nozzle body, and the nozzle body may be provided with a first developing liquid discharge port and a second developing liquid discharge port for discharging the first developing liquid and the second developing liquid respectively. The control unit may output a control signal for making a supply time of the second developing liquid longer than that of the first developing liquid so as to stabilize the temperature of the substrate surface upon supplying the second developing liquid. Further, the developing apparatus may include a first regulator to regulate a flow rate of the first developing liquid and a second regulator to regulate a flow rate of the second developing liquid, and the control unit may output a control signal for regulating each of the first and second regulators so that the flow rate of the second developing liquid becomes smaller than that of the first developing liquid.

According to another aspect of the present disclosure, a method is provided for forming a resist pattern by supplying a developing liquid to a substrate formed with a resist film and exposed so as to develop the substrate. and the method includes steps of mounting the substrate on a mount table horizontally, supplying a first developing liquid regulated in a first temperature from a first nozzle to the surface of the substrate on the mount table so as to form a resist pattern, and supplying a second developing liquid regulated in a second temperature higher than the first temperature from a second nozzle to the surface of the substrate on the mount table so as to modify the surface layer of the resist pattern in a state that acid can easily penetrate therein.

The method further comprises steps of supplying a cleaning liquid to the surface of the substrate after supplying the first developing liquid on the surface of the substrate and before supplying the second developing liquid on the surface of the substrate, and mixing a first developing liquid from a first supply line through which the first developing liquid is flowing while being regulated in a predetermined temperature and a second developing liquid from a second supply line through which the second developing liquid is flowing while being regulated in a temperature higher than the predetermined temperature, and regulating the flow ratio between the first supply line and the second supply line to make the temperature of the mixed liquid into a second temperature so as to use the mixed liquid as the second developing liquid.

For example, the predetermined temperature in the first supply line may be the first temperature, and a developing liquid flowing through the first supply line may be used in the supplying of the first developing liquid to the surface of the substrate, and for example, the supply time of the second developing liquid to the surface of the substrate is longer than that of the first developing liquid to stabilize the temperature of the second developing liquid on the surface of the substrate. Also, for example, the supplied flow rate of the second developing liquid is smaller than that of the first developing liquid. Additionally, the method include supplying acid to the surface of the substrate after supplying the second developing liquid to the surface of the substrate, and heating the substrate to spread out the acid, and supplying a developing liquid to the substrate for resolving the spread out part of the acid in the resist pattern to cause the resist pattern to be thinned.

According to yet another aspect of the present disclosure, a computer-readable storage medium stores a computer executable program that, when executed, causes a computer to perform the resist pattern forming method.

According to the present disclosure, since an exposed substrate is developed at a first temperature to form a resist pattern and then is developed at a second temperature higher than the first temperature, the surface layer part of the resist pattern can be modified into a state that acid can easily penetrate therein, and this is effective as a process for causing the resist pattern to be thinned. And, since the developing processes by both temperature developing liquids are performed by one developing apparatus, it is possible to reduce the number of modules (the number of the developing apparatus) when the developing apparatus is incorporated into the applying and developing apparatus. Also, when the setting temperature of the developing liquid from the first supply line is different from that of the developing liquid from the second supply line and theses developing liquids are mixed to be used as the second developing liquid, and then the temperature of the mixed liquid is regulated by controlling the flow ratio between the developing liquid in the first supply line and the developing liquid in the second supply line, the temperature of the developing liquid can be quickly changed even when the lot of the substrate is changed and the temperature of the second developing liquid is changed accordingly.

Hereinafter, an exemplary embodiment as a non-limiting example of the present disclosure will be described with reference to appended drawings. In all of the appended drawings, the same or corresponding members (or components) are designated with the same or corresponding reference numerals to omit repeated descriptions.

First Embodiment

A developing apparatus 1 of the present disclosure will be explained by referring to FIG. 1 which is a perspective view thereof and FIG. 2 which is a plan view thereof. Developing apparatus 1 includes four developing units 11*a*, 11*b*, 11*c*, 11*d*, four cleaning mechanisms 3*a*, 3*b*, 3*c*, 3*d* and a developing liquid supply unit 5. Developing units 11*a*, 11*b*, 11*c*, 11*d* are transversely arranged in a line. Each of developing units 11*a*, 11*b*, 11*c*, 11*d* is similarly configured to each other, and developing unit 11*a* will be explained herein as an example by referring to FIG. 3 which illustrates a longitudinal side thereof. Developing unit 11*a* includes a spin-chuck 12*a* which is a mount table to absorb the backside and a central part of a wafer W for holding wafer W horizontally, and spin-chuck 12*a* is connected with a rotary driving mechanism 14*a* via a rotation shaft 13*a*. Spin-chuck 12*a* is configured to rotate around a vertical axis by rotary driving mechanism 14*a* while holding wafer W and the center of wafer W is set to be located over the rotation shaft thereof. Rotary driving mechanism 14*a* receives a control signal from a control unit 1A (which will be described later) to control the rotation speed of spin-chuck 12*a*.

A cup body 21*a* is provided around spin-chuck 12*a*, and has an aperture part 20*a* at its upper part to surround wafer W on spin-chuck 12*a*. Cup body 21*a* includes an upper cup 22*a* and a lower cup 23*a*. Also, an inner cup 15*a* is provided inside cup body 21*a*. Upper cup 22*a* includes a cylindrical part 25*a* extending upwardly between lower cup 23*a* and inner cup 15*a*, and an inclination part 26*a* obliquely extending from an upper edge of cylindrical part 25*a* inwardly upward over the entire periphery thereof. Upper cup 22*a* is configured to be capable of ascending and descending by an elevating mechanism 27*a*. Upper cup 22*a* descends so as not to interrupt the movement of nozzles when each nozzle moves to developing unit 11*a* and ascends so as to restrict the scattering of the developing liquid and the cleaning liquid when shaking off these liquids.

Inner cup 15*a* includes a mountain-shaped sectional part 16*a* so as to guide the scattered liquid. A vertical guide 17*a* is provided extending downwardly in an outer end part of mountain-shaped sectional part 16*a*. A drain port 28*a* is provided for discharging a liquid drained from cup body 21*a*, and an exhaust port 29*a* is provided for evacuating the interior of cup body 21*a* in a bottom part of lower cup 23*a*.

Figure 3:
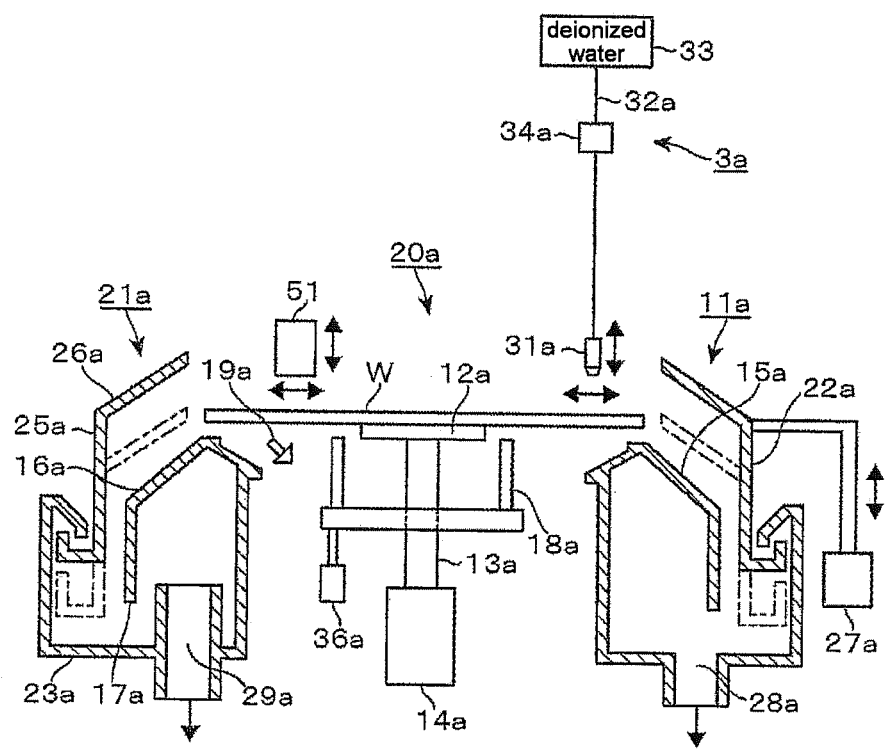
FIG. 3 is a longitudinal sectional view illustrating a developing unit of the developing apparatus.

Reference numeral 18*a* denotes elevating-pins capable of being elevated by an elevating mechanism 36*a*, and transferring wafer W between spin-chuck 12*a* and a substrate carrying means disposed outside the developing apparatus. While actual numbers of elevating-pins 18*a* are three, only two elevating-pins are shown in FIG. 1 and FIG. 3 for convenience. Further, reference numeral 19*a* denotes a backside cleaning nozzle to clean the backside of wafer W by supplying cleaning liquid, such as, for example, deionized water, to the backside of wafer W which is rotating during a developing process. Each part of developing units 11*b*, 11*c*, 11*d* corresponding to each part of developing unit 11*a* is designated in the same reference numerals as in developing units 11*a*, and symbols b, c and d are attached as index in each figures instead of symbol a.

Next, cleaning mechanisms 3*a*, 3*b*, 3*c* and 3*d* will be explained. Cleaning mechanisms 3*a*~3*d* are similarly configured to each other, and, cleaning mechanism 3*a* will be explained herein as a representative example. Cleaning mechanism 3*a* includes a deionized water nozzle 31*a* as a cleaning nozzle. Deionized water nozzle 31*a* includes a discharge port opened vertically downward, and the discharge port is formed in a circular shape of a shower head having pores. As shown in FIG. 3, pure water nozzle 31*a* is connected to a pure water source 33 via a supply line 32*a*, which stores a cleaning liquid, for example, deionized water for cleaning wafer W after developing. Deionized water source 33 is shared by cleaning mechanisms 3*a*~3*d*. Reference numeral 34*a* denotes a flow rate control unit provided in supply line 32*a*, and includes, for example, valve or mass flow controller, etc. Flow rate control unit 34*a* receives a control signal outputted from control unit 1A to control the supply of deionized water to wafer W.

As shown in FIG. 1, deionized water nozzle 31a is supported on an end of an arm body 35a horizontally extending in a right angle to an arrangement direction of developing units 11a~11d. The other end of arm body 35a is connected to a driving mechanism 36a provided on a base 10, and driving mechanism 36a integrally moves together with arm body 35a and deionized water nozzle 31a along with the longitudinal direction of a guide 37a extending in the arrangement direction of developing units 11a~11d. Further, diving mechanism 36a elevates deionized water nozzle 31a via arm body 35a. Deionized water nozzle 31a can move over a central part of wafer W disposed on spin-chuck 12a by the operation of driving mechanism 36a so as to supply deionized water to the central part of wafer W. The operation of driving mechanism 36a is controlled by receiving a control signal outputted from control unit 1A.

Each of the parts of cleaning mechanisms 3b, 3c, 3d corresponding to each part of cleaning mechanism 3a is designated in the same reference numerals as in cleaning mechanism 3a, and symbols b, c and d are attached in each figure instead of symbol a. Further, in a side of each developing unit 11a~11d, nozzle baths 38a~38d are provided in a form of cup with an upper side opened. When wafer W is not processed, deionized water nozzles 31a~31d are respectively contained in these nozzle baths 38a~38d in a waiting state.

Figure 4:
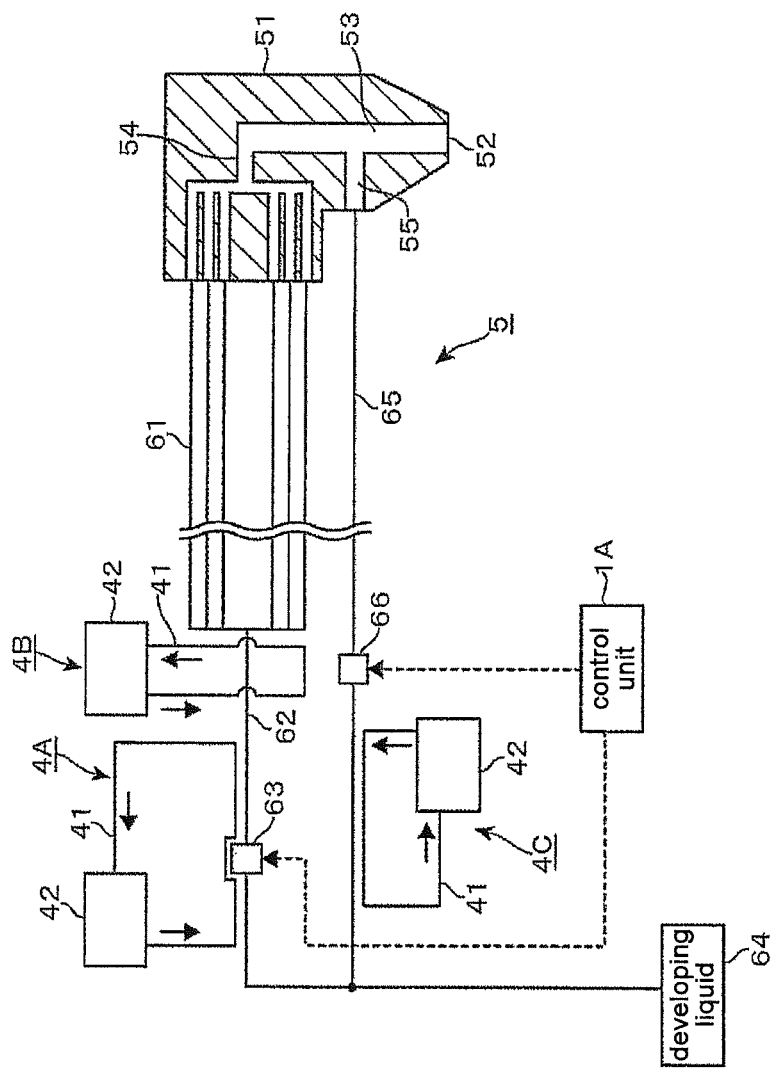
FIG. 4 is a view illustrating the configuration of a developing liquid supply unit provided in the developing apparatus.
Figure 5:
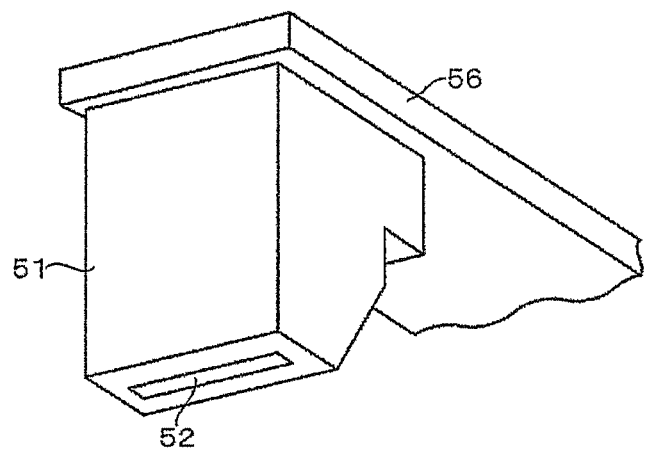
FIG. 5 is a lower perspective view illustrating a developing liquid nozzle provided in the developing liquid supply unit.

Subsequently, a developing liquid supply mechanism 5 will be explained by referring to FIG. 4 and FIG. 5. FIG. 4 illustrates the configuration of developing liquid supply mechanism 5, and FIG. 5 illustrates the lower perspective view of developing liquid nozzle body 51 constituting developing liquid supply mechanism 5. Developing liquid nozzle body 51 moves diametrically from over peripheral end of wafer W disposed on each spin-chuck 12a~12d toward over the central part of the wafer to supply the developing liquid. Developing liquid nozzle body 51 is provided with a discharge port 52, through which room temperature developing liquid for normal developing process and high temperature developing liquid for modifying a surface of the resist pattern to make acid to be easily penetrating into the surface thereof. Here, a process for forming a resist pattern using a room temperature developing liquid is referred as a normal developing process, and a process for modifying the resist pattern using a high temperature developing liquid is referred as high temperature developing process. Discharge port 52 is formed in a slit shape, and the longitudinal direction thereof is parallel to the moving direction of developing liquid nozzle body 51.

Developing liquid nozzle body 51 is formed with a flow path 53 continuous to discharge port 52, and the upstream side of flow path 53 is branched into a flow path 54 through which high temperature developing liquid flows and a flow path 55 through which room temperature developing liquid flows. The upstream side of flow path 54 is branched into a plurality of flow paths, and such branched flow paths 54 are connected with downstream end of pipe 61. An upstream side of pipe 61 joins to each other forming pipe 62. The upstream side of pipe 62 is connected to a developing liquid source 64 in which a developing liquid is stored, via a flow rate regulating unit 63. Pipes 61, 62 and flow paths 54 constitute a first supply line.

Also, an end of pipe 65 is connected to an upstream side of flow path 55. The other end of pipe 65 is connected to pipe 62 at the upstream side of flow rate regulating unit 63. A flow rate control unit 66 is provided in pipe 65. Pipe 65 and flow path 55 constitute a second supply line for supplying a second developing liquid. Flow rate regulating units 63, 66 are constituted by, for example, an air operated valve having a function to regulate flow rate, and receives a control signal outputted from control unit 1A to control supply/stop of high temperature developing liquid and room temperature developing liquid to discharge port 52, respectively. In order to prevent the thermal conductance from occurring between flow path 54 and flow path 55 influencing on a temperature of developing liquid supplied to wafer W, developing liquid nozzle body 51 is made of a resin, for example, fluorine resin capable of obtaining high thermal insulation property.

Further, developing liquid supply mechanism 5 includes temperature regulating units 4A, 4B, 4C configured as a heat exchanger, for example. Temperature regulating unit 4A is provided in a front stage side of flow path consisting of pipe 62 and pipe 61, and temperature regulating unit 4B is provided in a rear stage side of the flow path. Temperature regulating units 4A, 4B include a fluid circulation path 41 and a heating unit 42 for heating the fluid flowing through fluid circulation path 41. A heat exchange occurs between fluid circulation path 41 of temperature regulating unit 4A and pipe 62, and between fluid circulation path 41 of temperature regulating unit 4B and pipes 61, 62. By these heat exchanges, the temperature of high temperature developing liquid supplied to discharge port 52 through flow path 54 is regulated in a temperature range of 30° C. to 60° C., for example, in a temperature of 50° C.

Temperature regulating unit 4C is similarly configured to temperature regulating units 4A, 4B, and a heat exchange occurs between fluid circulation path 41 thereof and pipe 65 at an upstream side of flow rate control unit 66. And, by this heat exchange, the temperature of room temperature developing liquid supplied to discharge port 52 through flow path 55 is regulated in a temperature range of 20° C. to 25° C., for example in a temperature of 23° C. The temperatures of high temperature developing liquid and room temperature developing liquid are not limited to above temperature ranges, but the temperature of high temperature developing liquid may be regulated so as to be higher than that of room temperature developing liquid.

Figure 2:
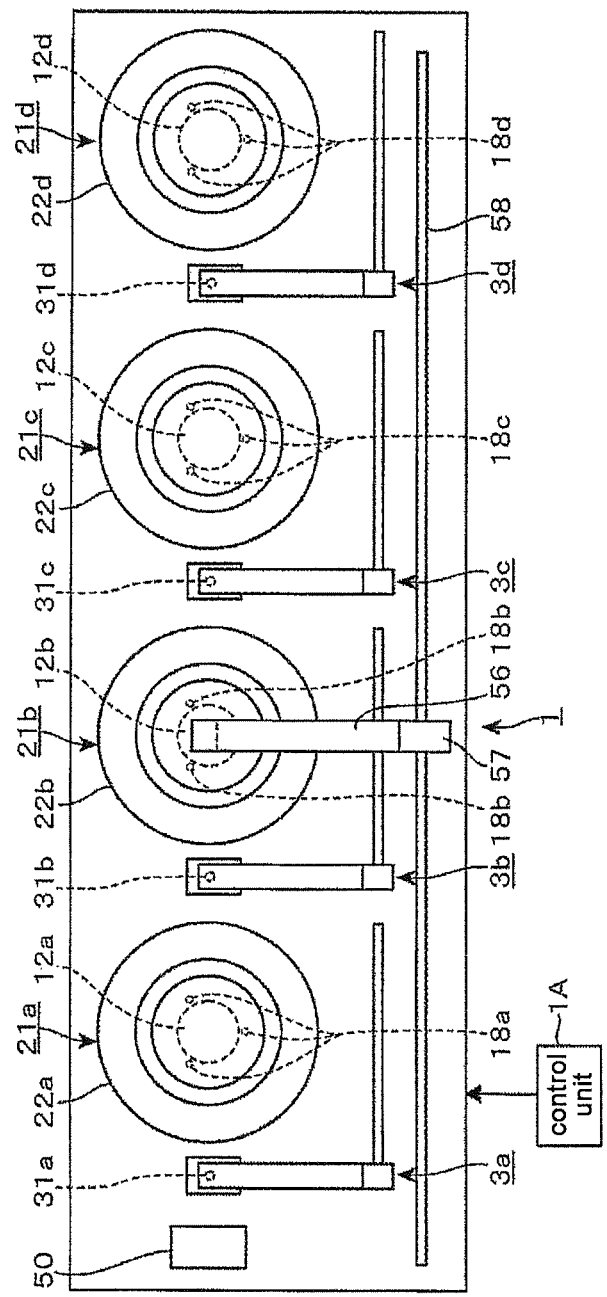
FIG. 2 is a plan view illustrating the developing apparatus.

As shown FIG. 1 and FIG. 2, developing liquid nozzle body 51 is supported on an end of arm body 56 with connected thereto, and the other end of arm body 56 is connected to a driving mechanism 57 provided on base 10. Reference numeral 58 denotes a guide, which is provided on base 10 to extend in an arrangement direction of developing units 21a to 21c. Driving mechanism 57 integrally moves together with arm body 56 and developing liquid nozzle body 51 along with the longitudinal direction of guide 58. Driving mechanism 57 can elevate developing liquid nozzle body 51 via arm body 56. The operation of driving mechanism 57 is controlled by receiving a control signal outputted from control unit 1A.

In base 10, a cup shaped nozzle bath 50 upwardly opened is provided over an extending line along arrangement direction of developing unit 11a to 11c. Developing liquid nozzle body 51 is stored in nozzle bath 50 while wafer W is not processed.

Developing apparatus 1 is provided with a control unit 1A including a computer, for example. Control unit 1A includes data processing part having a program, a memory and a CPU, etc, and the program stores commands (each step) for allowing control unit 1A to send control signals to each unit of developing apparatus 1 and to perform each processing process mentioned above. Also, for example, the memory has an area in which values of processing parameters such as a processing temperature, a processing time, a supply amount of developing liquid or a power value are stored. These parameters are read out when CPU processes each command of the program, and control signals according to the values of theses parameters are sent to each unit of developing apparatus 1. The program (including a program relating to an input operation or a display of processing parameter) may be stored in a computer storage medium such as, for example, flexible disk, compact disk, hard disk, MO (magneto-optical disk), memory card, etc, to be installed in control unit 1A.

In this developing apparatus 1, a transfer timing of carrying wafer W to each developing unit 11a~11d is preset, and depending on the transfer timing, developing liquid nozzle body 51 moves to each developing unit 11 to process wafer W. In this example, developing liquid nozzle body 51 moved from nozzle bath 50 to a developing unit 11 returns to nozzle bath 50 after completing the development process in that developing unit, and then moves to another developing unit 11 in which new wafer W is carried in.

Figure 6:
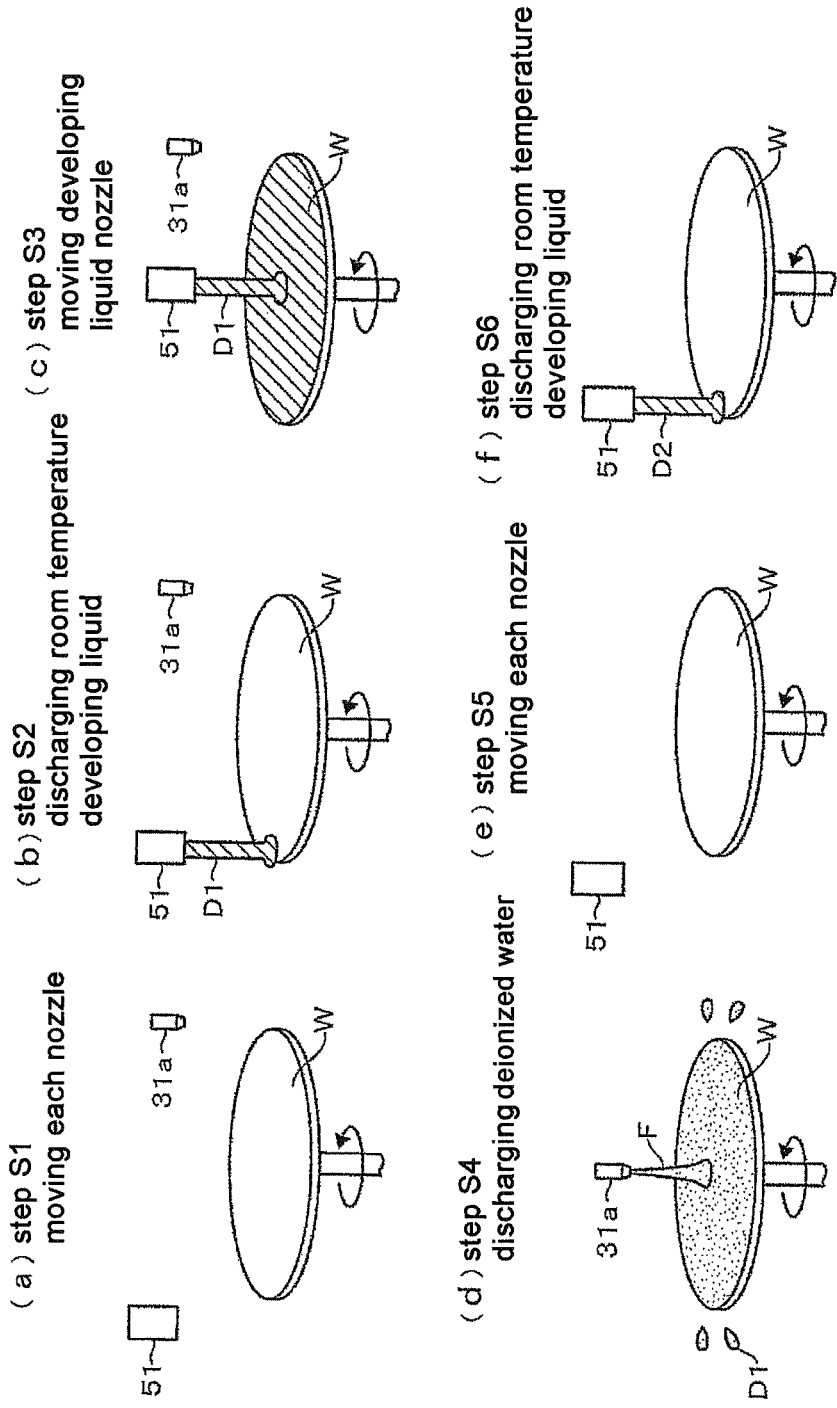
FIGS. 6a, 6b, 6c, 6d, 6e, 6f are process chart illustrating procedures of the processes performed by the developing apparatus.
Figure 8:
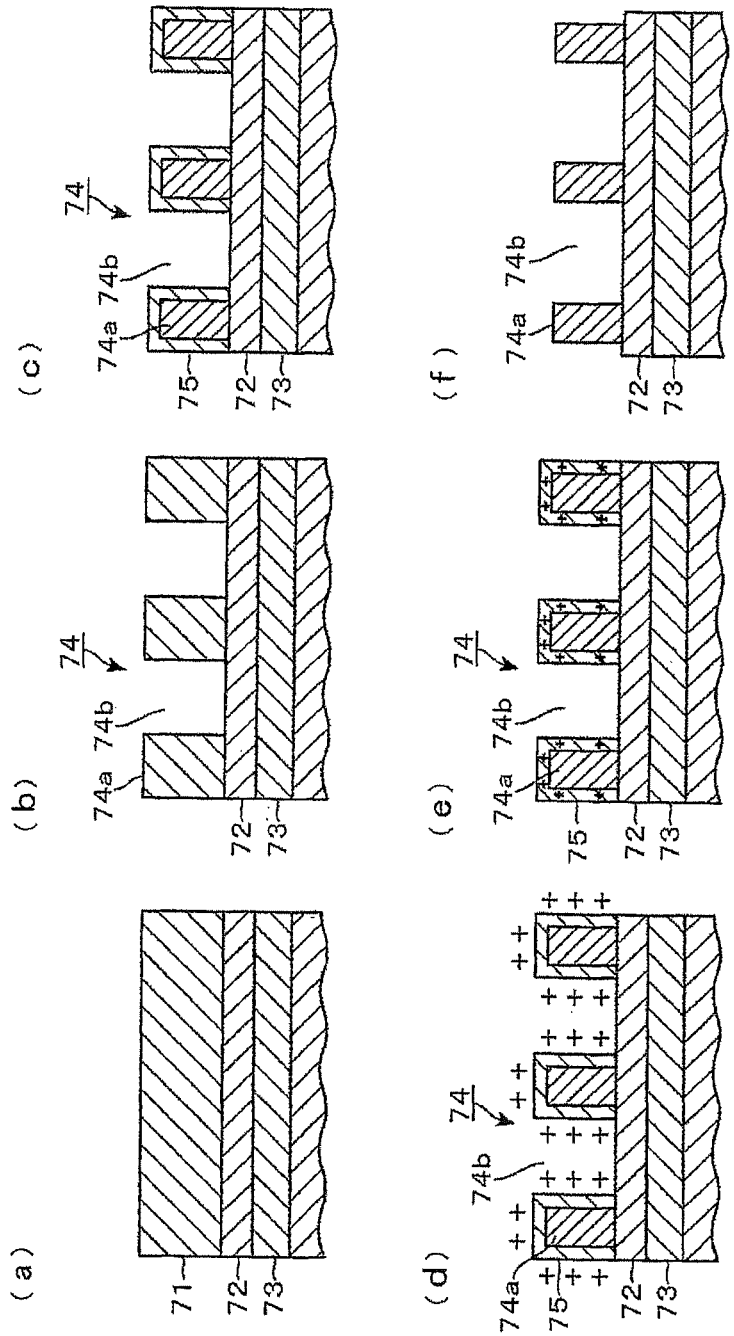
FIGS. 8a, 8b, 8c, 8d, 8e, 8f are longitudinal sectional side views illustrating the surface of a wafer.
Figure 9:
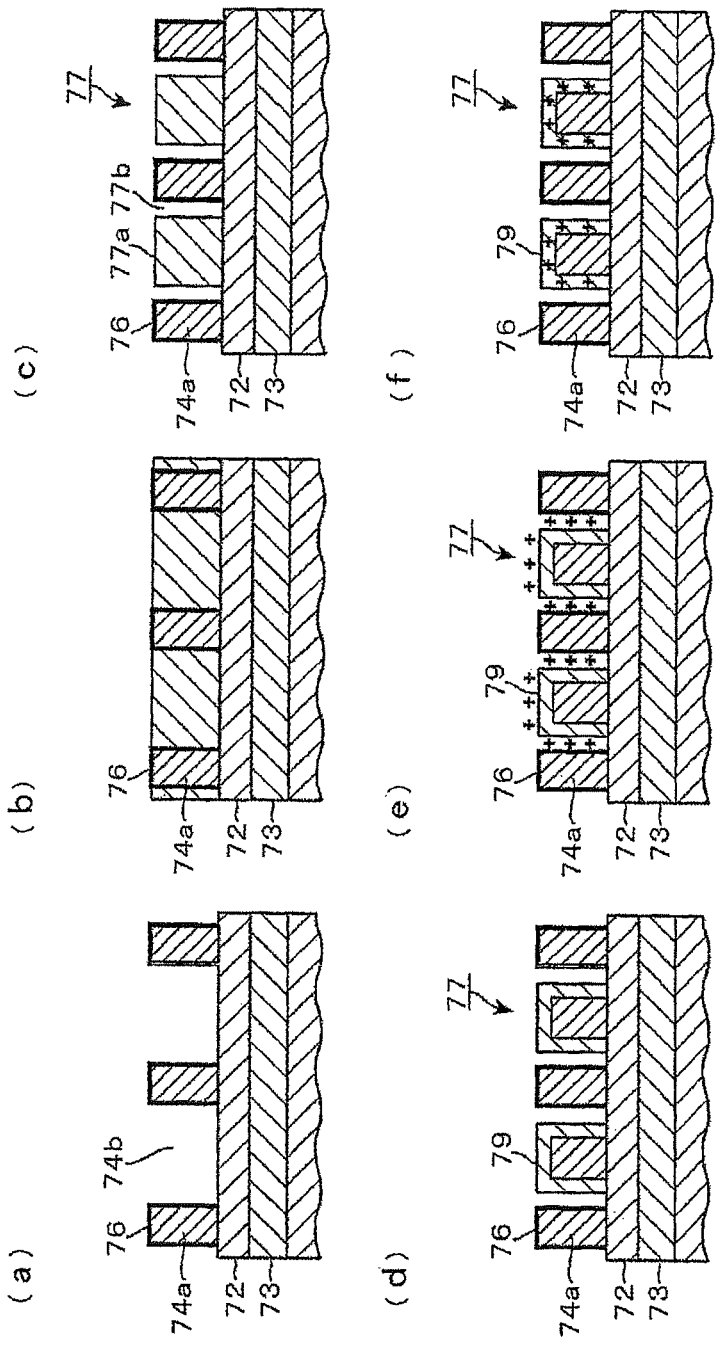
FIGS. 9a, 9b, 9c, 9d, 9e, 9f are longitudinal sectional side views illustrating the surface of a wafer.
Figure 10:
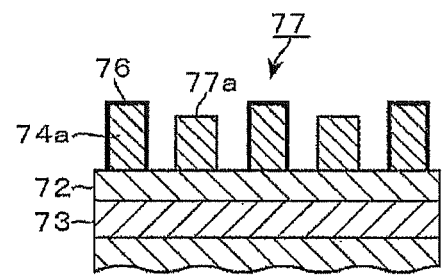
FIG. 10 is a longitudinal sectional side view illustrating the surface of a wafer.

Subsequently, the double-patterning method adapted with the slimming process as mentioned in background of the present disclosure will be explained by referring to FIG. 6 and FIG. 7 illustrating developing process performed in developing unit 11a of developing apparatus 1. Also, FIGS. 8~10 illustrate sequential views that the surface of wafer W is processed and modified by developing apparatus 1 and external processing apparatus, in the double-patterning method, and accordingly are also referred for the explanation. FIG. 8(a) illustrates the surface of wafer W immediately before the wafer W is carried into developing unit 11a showing that a resist film 71, an anti-reflect film 72 and a lower layer film 73 are laminated on the surface in this order from the top. Resist film 71 has been exposed according to a predetermined pattern.

First, wafer W is carried into developing unit 11a by a substrate carrying means, and further carried to spin-chuck 12a via elevating-pin 18a. Wafer W rotates, for example, in a speed of 1000 rpm, and as shown in FIG. 6(a), developing liquid nozzle body 51 moves over one end of wafer W, and deionized water nozzle 31a moves over the other end of wafer W [step S1: FIG. 6(a)]. Room temperature developing liquid D1 is discharged from developing liquid nozzle body 51 on the one end of wafer W, for example, in a speed of 600 mL/min [step S2: FIG. 6(b)], and developing liquid nozzle body 51 moves toward central part of wafer W while discharging room temperature developing liquid D1 thereby coating the surface of wafer W with room temperature developing liquid D1. After, for example, one second is elapsed from the start of discharging room temperature developing liquid D1, developing liquid nozzle body 51 stops over the central part of wafer W, and the room temperature developing liquid D1 continues to be discharged [step S3: FIG. 6(c)].

After, for example, approximately eight seconds are elapsed from the stop of developing liquid nozzle body 51, room temperature developing liquid D1 stops to be discharged, and developing liquid nozzle body 51 retreats to nozzle bath 50 and deionized water nozzle 31a is positioned over the central part of wafer W. The rotating speed of wafer W decreases to 500 rpm, for example, and deionized water F is discharged on the central part of wafer W. The discharged deionized water F spreads out to the peripheral edge of wafer W by a centrifugal force. The rotating speed of wafer W increases and reaches, for example, up to 1500 rpm, and the deionized water is discharged from backside cleaning nozzle 19a to the central part of wafer W to clean the backside thereof. On the surface of wafer W, room temperature developing liquid D1 and a residue of resist modified by room temperature developing liquid D1 are swept away by deionized water F [step S4: FIG. 6(d)], and as shown in FIG. 8(b), a resist pattern 74 consisting of wall part 74a and aperture part 74b is formed.

After each of deionized water nozzle 31a and backside cleaning nozzle 19a stops discharging deionized water, deionized water F is swept away from the surface of wafer W by rotation of wafer W, and deionized water nozzle 31a retreats to nozzle bath 38a. The rotating speed of wafer W decreases to 500 rpm, for example, and developing liquid nozzle body 51 moves from nozzle bath 50 over one end of wafer W [step S5: FIG. 6(e)]. Thereafter, high temperature developing liquid D2 is discharged from developing liquid nozzle body 51 on the one end of wafer W in an amount of, for example, 150 mL/min~300 mL/min [step S6: FIG. 6(f)], and developing liquid nozzle body 51 moves over the central part of wafer W while discharging high temperature developing liquid D2 thereby coating the surface of wafer W with high temperature developing liquid D2. After, for example, one second is elapsed from the start of discharging high temperature developing liquid D2, developing liquid nozzle body 51 stops over the central part of wafer W, and high temperature developing liquid D2 continues to be discharged [step S7: FIG. 7(a)]. As shown in FIG. 8(c), the surface layer of wall part 74a in resist pattern 74 is modified to be elongated by a heat of high temperature developing liquid D2 so as to form a modified part 75 into which acid can easily penetrate, as will be described later.

After, for example, approximately 40~60 seconds are elapsed from the stop of developing liquid nozzle body 51, high temperature developing liquid D2 stops to be discharged, and developing liquid nozzle body 51 retreats to nozzle bath 50, and deionized water nozzle 31a is positioned over the central part of water W. The rotating speed of wafer W decreases to 500 rpm, for example, and deionized water F is discharged on the central part of wafer W. The discharged deionized water F spreads out to the peripheral edge of wafer W by a centrifugal force. The rotating speed of wafer W increases to 1500 rpm, for example, and deionized water is discharged from the backside of cleaning nozzle 19a to the backside of wafer W to clean the backside thereof. On the surface of wafer W, high temperature developing liquid D2 is swept away by deionized water F to be removed [step S8: FIG. 7(b)]. Subsequently, each of deionized water nozzle 31a and backside cleaning nozzle 19a stops discharging the deionized water, and deionized water nozzle 31a retreats to nozzle bath 38a. After the deionized water is swept away from the surface of wafer W by the rotation of wafer W, the rotation of wafer W stops, and wafer W is carried out of developing apparatus 1 in a procedure contrary to the procedure when the wafer is carried into developing apparatus 1.

Afterward, wafer W is carried into an acid treating device, and is supplied with an acid containing chemical liquid. FIG. 8(d) illustrates a state in which the chemical acid is supplied so that the chemical acid is attached to the surface of resist pattern 74. When acid is supplied to the modified part subjected to the high temperature developing process, acid may be supplied in either a liquid state or a gas state. After acid is supplied, wafer W is carried to a heating device to be heated therein, so that the acid is spread out into modified part 75 of wall part 74a in resist pattern 74, as shown in FIG. 8(e). After that, wafer W is again carried into developing apparatus 1, and steps S1~S3 are performed, so that room temperature developing liquid D1 is supplied on the surface of wafer W. Subsequently, step S4 is performed so that the deionized water is supplied to the surface of wafer W so as to remove modified part 75. As a result, as shown in FIG. 8(f), resist pattern 74 is subjected to a slimming process to be thinned, that is, the width of wall part 74a of resist pattern 74 is narrowed.

Each of pure water nozzle 31a and backside cleaning nozzle 19a stops discharging deionized water, and deionized water F is swept away from the surface of wafer W, and then deionized water nozzle 31a retreats to nozzle bath 38a. And then, the rotation of wafer W stops, and wafer W is again carried out of developing apparatus 1. Thereafter, wafer W is carried to a chemical liquid supply device for forming a protective film, and the chemical liquid supply device supplies a chemical liquid, so that the surface of wall part 74a in resist pattern 74 is subjected to a freezing process in which a protective film 76 is formed to protect wall part 74a, as shown in FIG. 9(a). Subsequently, wafer W is carried to a resist applying device, and as shown in FIG. 9 (b), a resist is applied to the wafer, and then, wafer W is carried to an exposing device to be exposed in a predetermined pattern.

Thereafter, wafer W is again carried to one of developing units, for example, developing unit 11a of developing apparatus 1, and steps S1~S4 are performed to form a resist pattern 77, as shown in FIG. 9(c). Resist pattern 77 is formed with wall part 77a which is formed between slimmed wall parts 74a with spacing part 77b sandwiched therebetween. Subsequently, steps S5~S8 are performed, so that the surface layer of wall part 77a is modified to form a modified part 79, as shown in FIG. 9(d). Subsequently, as mention above, the processing of wafer in developing apparatus 1 is completed, and wafer W is carried out of developing apparatus 1.

Thereafter, wafer W is again carried to the acid treating device, and is supplied with the acid containing chemical liquid, so that, as shown in FIG. 9(e), acid is attached to the surface of resist pattern 77. Also, wafer W is carried to the heating device to be heated therein, so that the acid is penetrated into modified part 79 to be spread out, as shown in FIG. 9(f). And then, wafer W is again transferred to developing apparatus 1. And, above steps S1~S4 are performed and developing liquid and deionized water are sequentially supplied to the surface of wafer W to remove modified part 79. By doing so, as shown in FIG. 10, a slimming process for allowing the width of wall part 77a to be narrowed can be performed. After pattern is formed in such a manner, wafer W is carried to an etching device, and then anti-reflect film 72 and lower layer film 73 are etched in the etching device while using a resist as a mask.

According to developing apparatus 1, since exposed wafer W is developed by the room temperature developing liquid to form a resist pattern and then developing liquid with a higher temperature than the room temperature developing liquid is supplied on wafer W, the surface layer of the resist pattern can be modified into a state that acid can easily penetrate therein, and this is effective as a process for causing the resist pattern to be thinned. And, since the developing processes by both temperature developing liquids are performed by one developing apparatus, it is possible to reduce the number of modules (the number of the developing apparatus) when the developing apparatus is incorporated into the developing and applying apparatus. Also, in an above process, by making the supply time of the high temperature developing liquid longer than that of the room temperature developing liquid, the temperature in the surface of wafer W is stabilized. By doing so, the modification of the resist pattern can be effectively performed. Also, in modifying the surface of the resist pattern, it may be desirable to allow the surface temperature of resist pattern to be maintained in a relatively high temperature, and as in the example of this embodiment, it is effective to restrict the flow rate of high temperature developing liquid D2 relative to that of room temperature developing liquid D1 within a range that allows the temperature necessary for the modification to be maintained, because this prevents the developing liquid used from being wasted.

Figure 11:
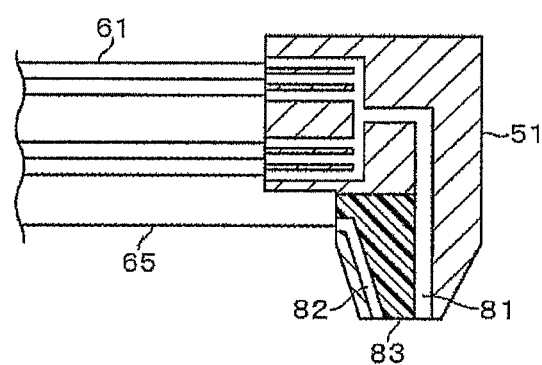
FIG. 11 is a longitudinal sectional side view illustrating another configuration of the developing liquid nozzle.

Next, a modified embodiment of developing liquid nozzle body 51 will be explained. Developing liquid nozzle body 51 shown in FIG. 11 is provided with a discharge port 81 connected to a pipe 61 of the high temperature developing liquid and a discharge port 82 connected to a pipe 65 of the room temperature developing liquid, respectively. Discharge ports 81, 82 are formed in a slit shape similar to discharge port 52, and can be arranged in parallel to the discharge developing liquid along the diameter direction of wafer W. And, an insulation material 83 formed from, for example, closed-cell nitrilic synthetic rubber or urethane foam, is provided between discharge ports 81, 82 so as to prevent developing liquid discharged through one of discharge ports 81, 82 from being affected by a heat of another discharge port.

Figure 12:
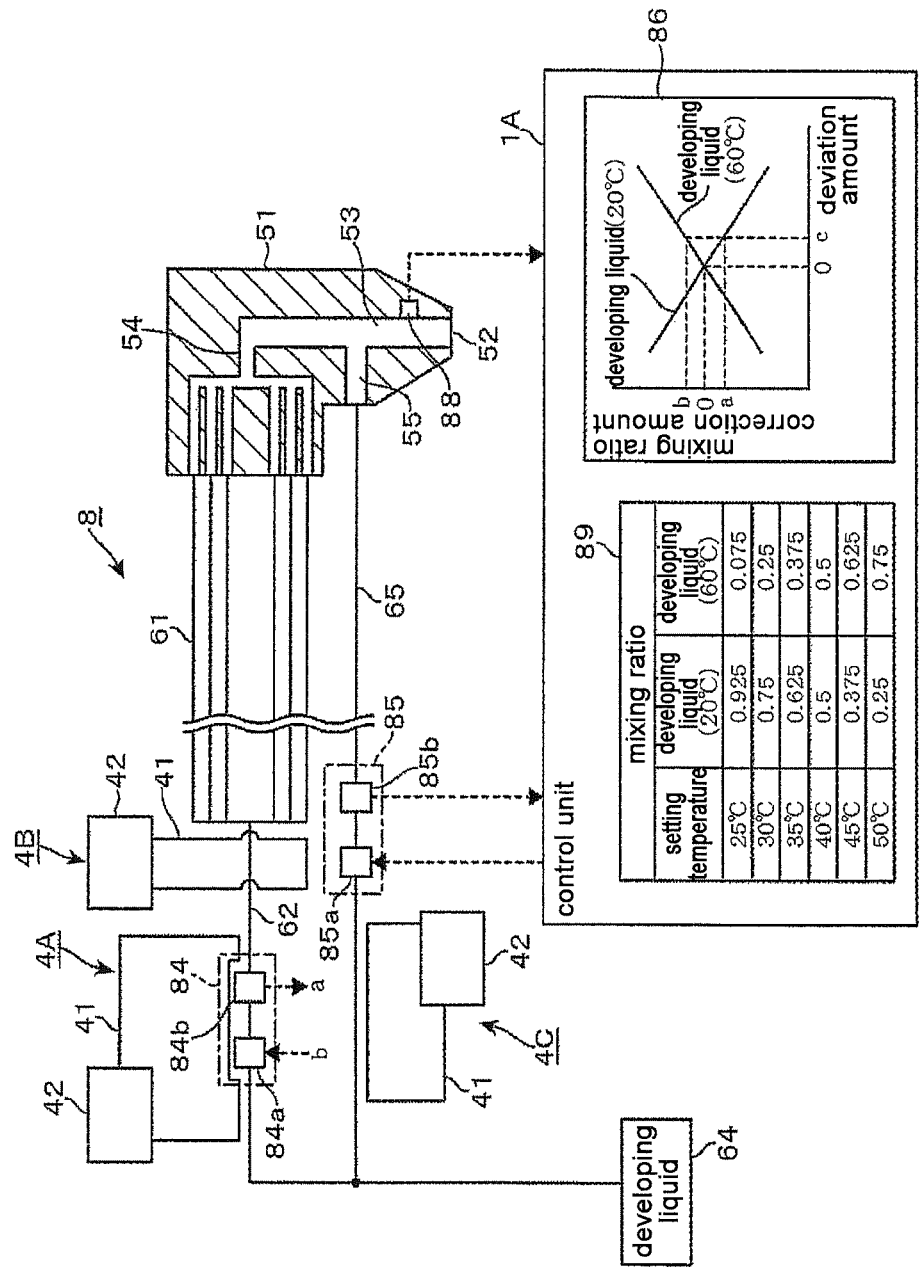
FIG. 12 is a view illustrating configuration of another developing liquid supply unit.

Next, yet another example of the developing liquid supply mechanism will be explained by referring to FIG. 12. In a developing liquid supply mechanism 8, developing liquids flowing through pipe 61 and pipe 65 are mixed at a path 53 as a join part near discharge port 52, so that high temperature developing liquid and room temperature developing liquid can be supplied to wafer W in a temperature set by user. In this example, the temperature of the developing liquid supplied to developing liquid nozzle body 51 through pipe 61 is regulated in 60° C. by temperature regulating units 4A, 4B, and the temperature of the developing liquid supplied to developing liquid nozzle body 51 through pipe 65 is regulated in 20° C. by temperature regulating unit 4C.

Flow rate regulating unit 84 provided in pipe 62 includes a flow rate regulating valve 84a provided in its upstream side and a flow meter 84b provided in its downstream side. Flow rate regulating unit 85 provided in pipe 65 includes a flow rate regulating valve 85a provided in its upstream side and a flow meter 85b provided in its downstream side. Flow meters 84b, 85b respectively measure flow rates of the developing liquid flowing through each pipes 62, 65 and output a signal according to the measured values to control unit 1A. Control unit 1A outputs control signals to flow rate regulating valves 84a, 85a for making the flow rate value measured by flow meters 84b, 85b equal to flow rate value calculated by control unit 1A which will be described later, thereby regulating the degree of opening of the flow rate regulating valves. Also, flow path 53 of developing liquid nozzle body 51 is provided with a temperature sensor 88 to detect the temperature of the developing liquid flowing through flow path 53, and temperature sensor 88 outputs a signal to control unit 1A according to the detected value.

Also, the memory of control unit 1A stores, for example, a table 89 shown in the figure. In this table, setting temperatures of the developing liquid supplied to wafer W correspond to the mixing ratios of 20° C. developing liquid over 60° C. developing liquid supplied to developing liquid nozzle body 51 through each pipe 62, 65 for obtaining the developing liquid with such setting temperatures. Further, only a portion of the stored setting temperatures and mixing ratios is illustrated in table 89 of FIG. 12, and it is possible for a user to set the temperatures of the developing liquid in a temperature other than the temperature illustrated in table 89, and the mixing ratio is stored for each setting temperature. And, the user can set a desired temperature and flow rate of the developing liquid respectively supplied to wafer W using an input means (not shown) in a room temperature developing process and a high temperature developing process.

After performing such a setting, control unit 1A reads out a mixing ratio from table 89 corresponding to the temperature of the developing liquid supplied to wafer W set by the user in a room temperature developing process and a high temperature developing process. Based on the mixing ratio read out from the table and the flow rate set by the user, flow rate of 60° C. developing liquid and flow rate of 20° C. developing liquid supplied to developing liquid nozzle body 51 are calculated. And, control unit 1A outputs a control signal to flow rate regulating units 84, 85 to control the supply of the calculated flow rate of the 60° C. developing liquid and 20° C. developing liquid to developing liquid nozzle body 51, respectively.

It is assumed that, the flow rate of 23° C. developing liquid is set at 600 mL/min in a room temperature developing process, and the flow rate of 45° C. developing liquid is set at 150 mL/min in a high temperature developing process by the user. And, in the room temperature developing process, control unit 1A reads out the mixing ratio corresponding to 23° C. as a setting temperature of the developing liquid from table 89. As illustrated in FIG. 12, this mixing ratio is 0.925 for 20° C. developing liquid and is 0.075 for 60° C. developing liquid. Control unit 1A determines the flow rate of 20° C. developing liquid as 600×0.925=555 mL/min and the flow rate of 60° C. developing liquid as 600×0.075=45 mL/min, based on the calculation. And, each developing liquid is supplied to developing liquid nozzle body 51 at the determined flow rates. And, in the high temperature developing process, control unit 1A reads out the mixing ratio from table 89 corresponding to 45° C. as a setting temperature of the developing liquid. As illustrated in FIG. 12, this mixing ratio is 0.375 for 20° C. developing liquid and is 0.625 for 60° C. developing liquid. Control unit 1A determines the flow rate of 20° C. developing liquid as 150×0.375=56.25 mL/min and the flow rate of 60° C. developing liquid as 150×0.625=93.75 mL/min, based on the calculation. And, each developing liquid is supplied to developing liquid nozzle body 51 at the determined flow rates.

Further, when the developing liquid is supplied to developing liquid nozzle body 51 in such a manner, temperature sensor 88 monitors the temperature of the developing liquid mixed in flow path 53. Control unit 1A calculates the deviation amount between the temperature set by the user and detected by temperature sensor 88, and respectively changes the flow rates of the 60° C. developing liquid and the 20° C. developing liquid supplied to developing liquid nozzle body 51 based on the detected deviation amount. Specifically, the memory of control unit 1A stores data 86 in which the deviation amount that corresponds to a correction amount (a) of a mixed ratio for the 20° C. developing liquid and a correction amount (b) of a mixed ratio for the 60° C. developing liquid. Here, b equals −a. Control unit 1A reads out corresponding correction amounts a, b of the mixed ratio, based on the calculated deviation amount. And, the readout correction amount of the mixed ratio for the 60° C. developing liquid and the 20° C. developing liquid are respectively added to the mixing ratio of the 60° C. developing liquid and the 20° C. developing liquid readout from data 86 thereby changing the mixing ratio.

That is, it is assumed that the setting temperature is 50° C., and the 20° C. developing liquid and the 60° C. developing liquid are mixed in a ratio of 0.25:0.75 for the setting temperature, according to table 89. In addition, when the deviation amount (c) is detected, the correction amount (a) of the mixed ratio for the 20° C. developing liquid and the correction amount (b) of the mixed ratio for the 60° C. developing liquid each corresponding to the deviation amount are read out from data 86. And, the mixed ratio for the 20° C. developing liquid is corrected to 0.25+a, and the mixed ratio of the 60° C. developing liquid is corrected to 0.75+b, and the flow rates of the 20° C. developing liquid and the 60° C. developing liquid are newly calculated according to the corrected mixed ratio, respectively. And, each developing liquid is supplied to developing liquid nozzle body 51 based on the calculated flow rates.

When the lot of wafer W carried into developing apparatus 1 is changed, film type or film quality of the resist film formed on wafer W can be changed. In this case, it is necessary to change the temperature of the developing liquid so as to modify the surface of the resist pattern. By mixing the developing liquids having different temperatures at the upstream of discharge port 52 and setting the mixed ratio for each lot as described above, it is possible to improve the throughput, because the temperature of the developing liquid supplied to wafer W can be quickly changed compared with a case that changes the heat amount of temperature regulating units 4A~4C for each lot. Also, in a room temperature developing process and a high temperature developing process, the temperature of the developing liquids may be changed during discharging the developing liquid to wafer W. Alternatively, the supply temperature of the developing liquids may be set for each wafer W in the same lot.

Also, when the developing liquids having different temperatures are mixed to supply the mixed developing liquid to wafer W as described above, a discharge port for discharging a room temperature developing liquid and a discharge port for discharging a high temperature developing liquid may be separately provided in developing liquid nozzle body 51. For example, in developing liquid supply mechanism 8 shown in FIG. 12, a room temperature discharge port is formed in addition to discharge port 52, flow rate regulating unit 85 of pipe 65 is branched at the downstream side thereof, and the branched pipe is connected to the room temperature discharge port. And, it is considered that the developing liquid can be supplied from pipe 65 through the room temperature discharge port or flow paths 55, 53 to discharge port 52 by the conversion of a valve. Also, the temperature of the developing liquid flowing through pipe 65 is controlled, for example, to 23° C. by temperature regulating unit 4C, for example, and the 23° C. developing liquid is supplied to wafer W through the room temperature discharge port in the room temperature developing process. And, in the high temperature developing process, the supply destination of the 23° C. developing liquid may be converted to flow path 55, 53 and discharge port 52, and the 23° C. developing liquid may be mixed with the 60° C. developing liquid at flow path 53 to form a high temperature developing liquid having a temperature set by the user. And the high temperature developing liquid may be supplied to wafer W through discharge port 52.

Figure 13:
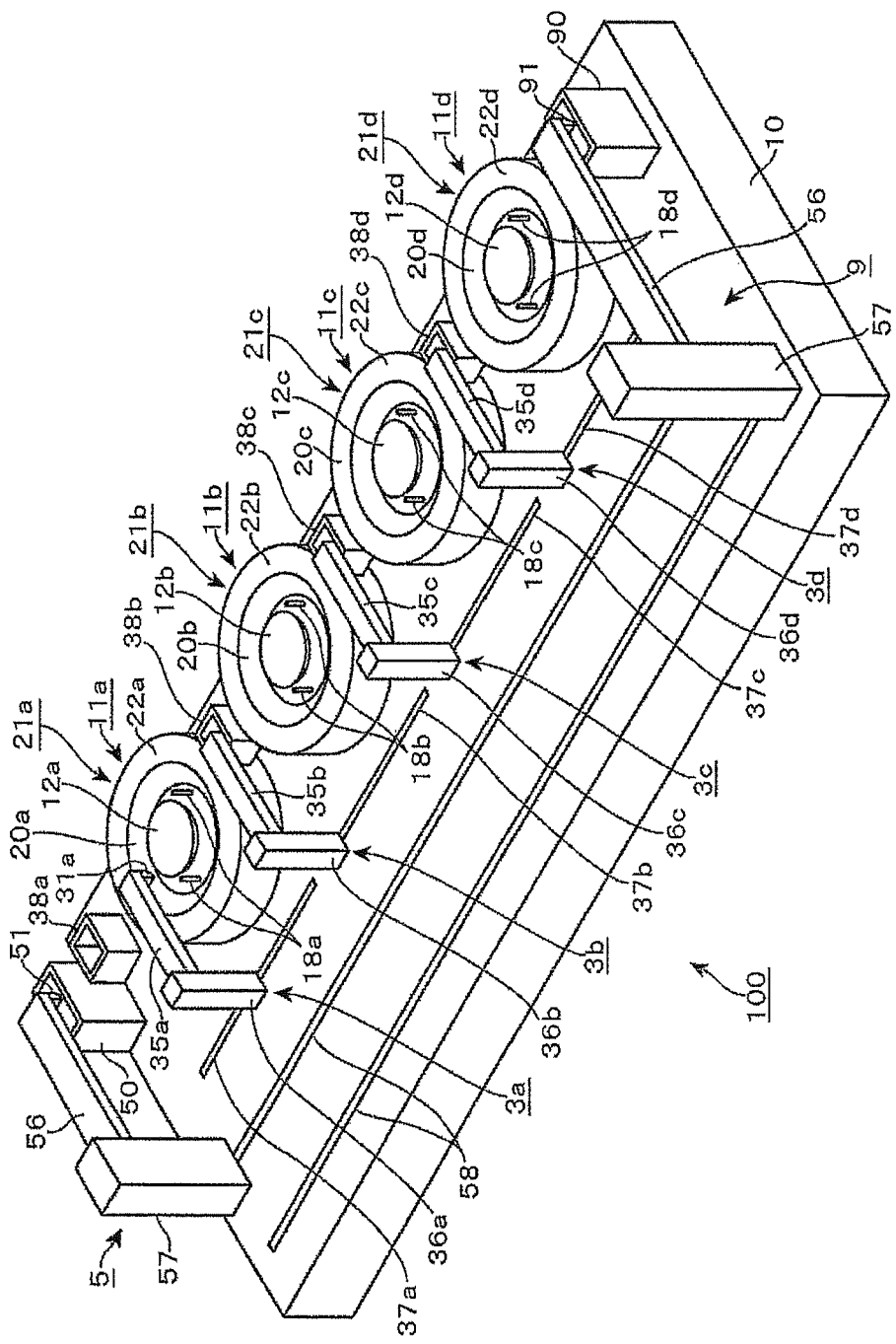
FIG. 13 is a perspective view illustrating another developing apparatus.

FIG. 13 illustrates another example of the developing apparatus 100. Developing apparatus 100 is provided with a developing liquid supply mechanism 9, in addition to developing liquid supply mechanism 5. Developing liquid supply mechanism 9, as in developing liquid supply mechanism 5, includes a developing liquid nozzle body 91, an arm body 56 to support developing liquid nozzle body 91, a driving mechanism 57 to elevate arm body 56, a guide 58 to move driving mechanism 57 transversely, and a nozzle bath 90 to hold developing liquid nozzle body 91 in an waiting position. Developing liquid nozzle body 91 supplies the developing liquid along a diameter direction of wafer W, as in developing liquid nozzle body 51. In this example, developing liquid nozzle body 51 supplies the high temperature developing liquid, and developing liquid nozzle body 91 supplies the room temperature developing liquid.

Figure 14:
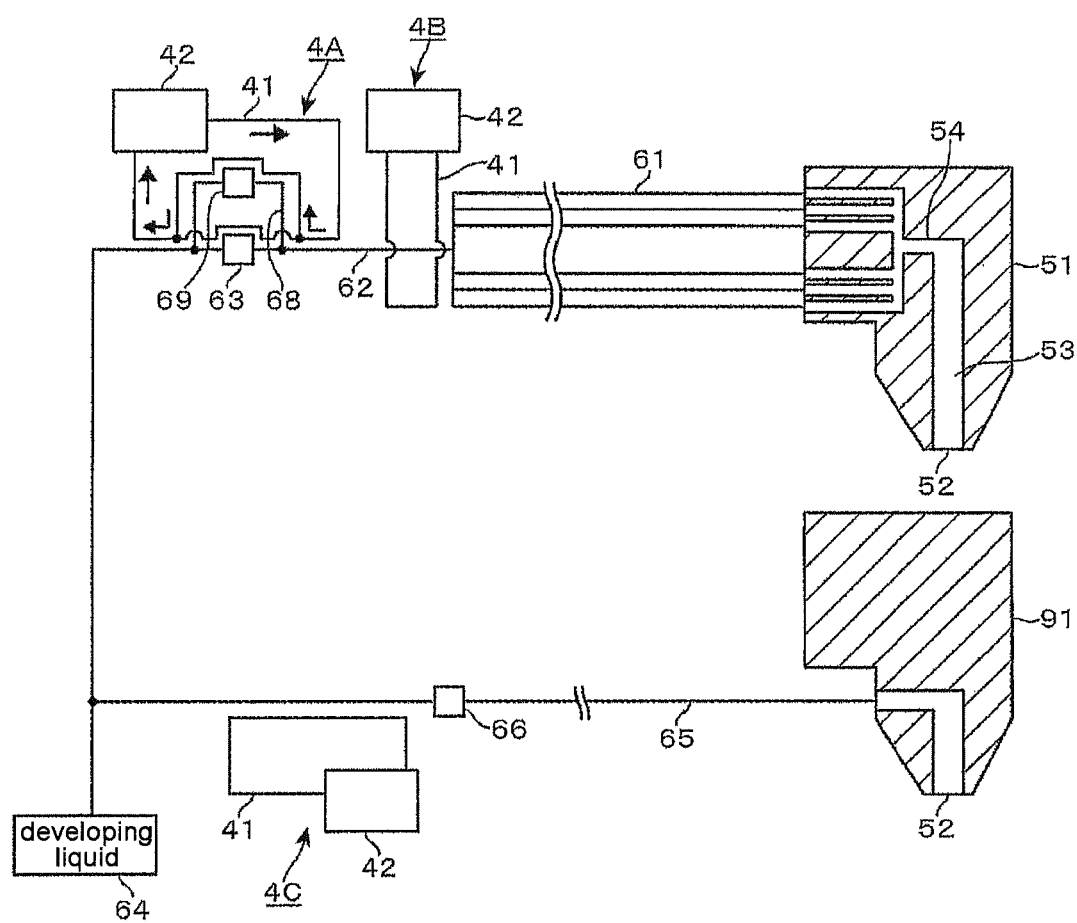
FIG. 14 is a view illustrating the configuration of a developing liquid supply unit provided in the developing apparatus.

FIG. 14 illustrates a piping system connected to developing liquid nozzle bodies 51, 91. Pipe 65 connected to developing liquid nozzle body 51 in the first embodiment can be connected to developing liquid nozzle body 91 to supply the developing liquid regulated in a temperature of 23° C., for example. And, pipe 62 branched from developing liquid nozzle body 51 constitutes a branched pipe 68, and the end of branched pipe 68 joins with pipe 62 at the upstream side of flow rate regulating unit 63. Branched pipe 68 is provided with flow control part 69 configured similarly to flow rate regulating unit 63 to control the supply of the developing liquid toward the downstream side.

Temperature regulating unit 4A can be configured to regulate the temperature of the developing liquid flowing through pipe 68 as well as pipe 62. Branched pipe 68 is configured to have the diameter smaller than the diameter of pipe 62, for example. And, developing apparatus 100 is configured in such a way that in a case that the developing liquid is supplied to developing liquid nozzle body 51 without going through branched pipe 68, the discharged amount of the developing liquid becomes small compared to a case that developing liquid is supplied to developing liquid nozzle body 51 through branched pipe 68. In this example, the developing liquid is supplied to wafer W in an amount of 600 mL/min without going through pipe 68 and in an amount of 150 mL/min with going through pipe 68, respectively.

Now, processing process by developing apparatus 100 will be explained by referring to FIG. 15 with the difference from the above embodiment as a center. First, while steps S1~S3 are performed, the supply of the room temperature developing liquid is performed by developing liquid nozzle body 91 rather than developing liquid nozzle body 51. Subsequently, step S4 is performed, and deionized water is supplied to the surface of wafer W. And then, the deionized water is swept away, and developing liquid nozzle body 51 moves over the peripheral end of rotating wafer W, so that high temperature developing liquid D2 is supplied to wafer W in an amount of 600 mL/min [FIG. 15(*a*)]. When developing liquid nozzle body 51 moves over the central part of wafer W, and the entire surface of wafer W is covered with high temperature developing liquid D2 [FIG. 15 (*b*)], the supply line of the developing liquid is switched and the flow rate of high temperature developing liquid D2 becomes 150 mL/min[FIG. 15(*c*)]. And, in order to make the temperature of the entire surface of wafer W uniform, developing liquid nozzle body 51 discharges the developing liquid in a continuous manner while reciprocating between over the central part of wafer W and over the peripheral end thereof [FIG. 15(*d*)]. After, for example, 60 seconds from the change of the flow rate of high temperature developing liquid D2, high temperature developing liquid D2 stops to be discharged. And then, above step S8 is performed, deionized water is supplied to wafer W, and high temperature developing liquid D2 is removed.

Developing apparatus 100 can achieve the same effect as in developing apparatus 1. Also, as mentioned above, it may be desirable to maintain the surface temperature of the resist in a relatively high temperature when modifying the resist surface by supplying the high temperature developing liquid, as mentioned above. Accordingly, by restricting the flow rate of the high temperature developing liquid after high temperature developing liquid D is coated on wafer W as mentioned above, it is possible to effectively eliminate waste of the used developing liquid. Although, in a process procedure by above developing apparatus 100, developing liquid nozzle body 51 is moved over the central part of wafer W and then reciprocated between over central part of water W and over peripheral end thereof for processing the surface of wafer W with high uniformity, it is also possible for developing liquid nozzle body 51 to move over the central part of wafer W, and then, to continuously discharge high temperature developing liquid D2 while it is positioned over the central part of wafer W. Although, in above example, in order to quickly form a developing liquid film and to increase the processing uniformity in the surface of wafer W, high temperature developing liquid D2 is supplied in a relatively large amount of 600 mL/min until developing liquid nozzle body 51 is positioned over the central part of wafer W, the developing liquid may be supplied in an amount of 150 mL/min, for example, without changing the flow rate of the developing liquid from the start of discharge to the stop of discharge.

Also, although, in above examples, the room temperature developing liquid is supplied to wafer W and then, deionized water is supplied to the surface of wafer W to surely remove the resist residue on the surface of wafer W, the resist residue may be swept away to be removed by supplying the room temperature developing liquid to wafer W and then high temperature developing liquid D2 to modify the surface layer of the resist pattern instead of supplying deionized water. Further, after performing the high temperature developing process, developing apparatus 1 may carry wafer W to a cleaning apparatus without performing a cleaning process, and the cleaning apparatus may clean wafer W to remove the developing liquid. Also, when high temperature developing liquid D2 is supplied to wafer W, developing liquid nozzle body 51 may be positioned over the central part of rotating wafer W, and may begin to discharge high temperature developing liquid D2. And then high temperature developing liquid D2 may be spread out over the peripheral part of wafer W by a centrifugal force to form a liquid film.

Figure 16:
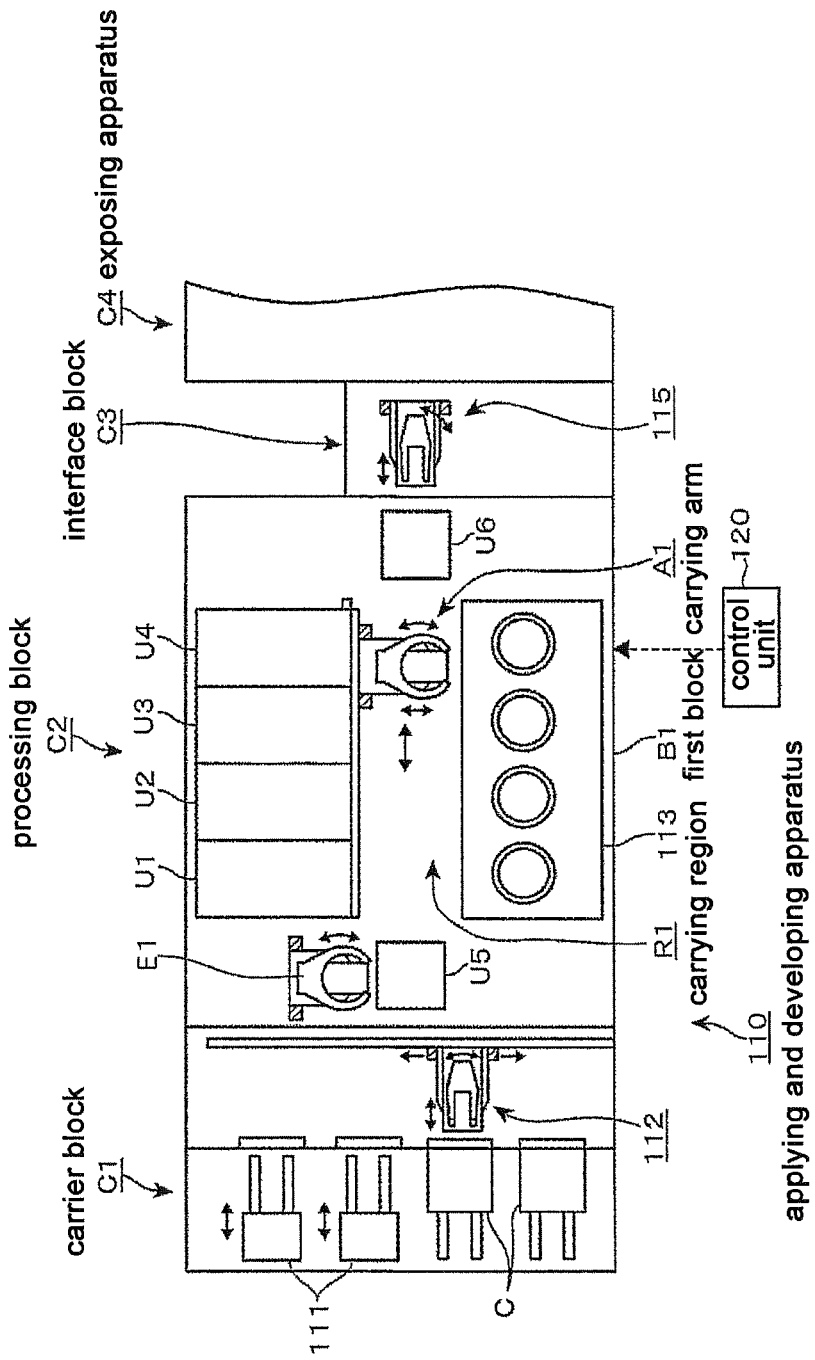
FIG. 16 is a plan view illustrating an applying and developing apparatus equipped with the developing apparatus.
Figure 17:
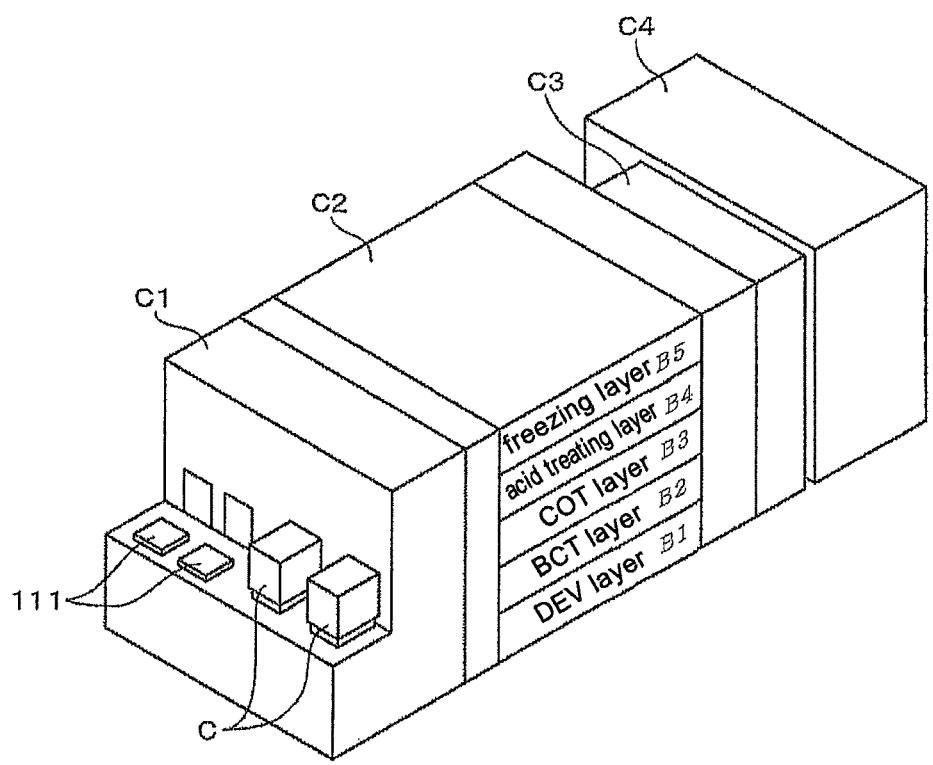
FIG. 17 is a perspective view illustrating the applying and developing apparatus.
Figure 18:
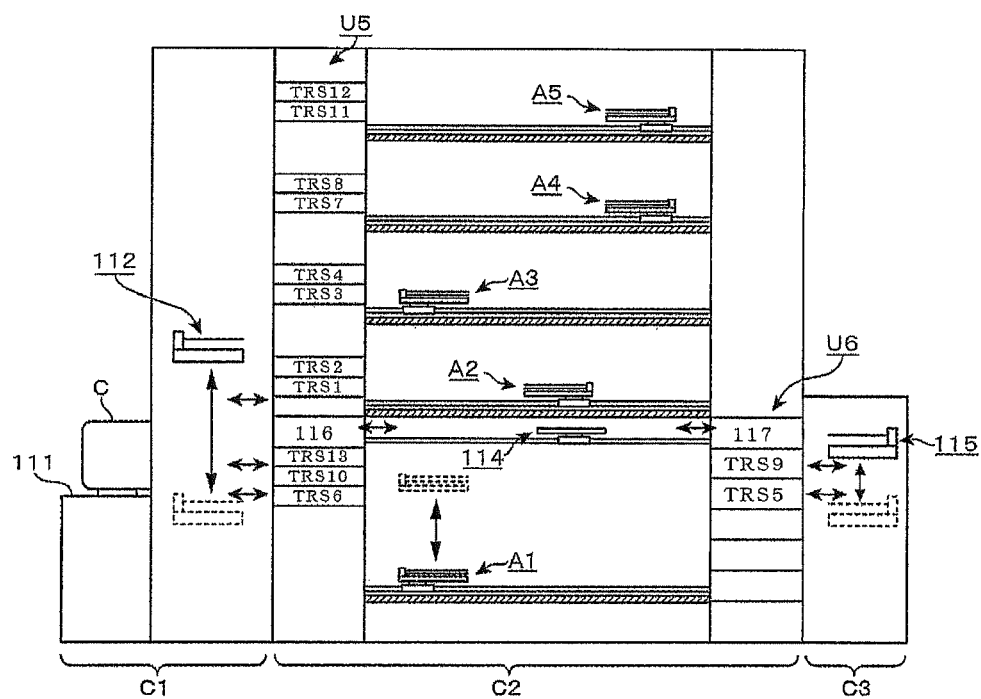
FIG. 18 is a longitudinal sectional plan view illustrating the applying and developing apparatus.

Next, an applying and developing apparatus 110 including the developing apparatus according to each embodiment as described above will be explained. FIG. 16 illustrates a plan view of a system in which an exposing apparatus C4 is connected to applying and developing apparatus 110, and FIG. 17 illustrates a perspective view of the system shown in FIG. 16. Also, FIG. 18 illustrates a longitudinal sectional view of applying and developing apparatus 110. Applying and developing apparatus 110 is provided with a carrier block C1, and a transfer arm 112 takes wafer W out of a closed type carrier C disposed on a mount table 111 of the carrier block to transfer it to a processing block C2, and a transfer arm 112 receives processed wafer W from processing block C2 to return it to carrier C.

In this example, as shown in FIG. 17, processing block C2 includes, in a laminated order from the bottom, a first block (DEV layer) B1 to perform a develop process, a second block (BCT layer) B2 to form an anti-reflection film, a third block (COT layer) B3 to form a resist film, a fourth block (acid treating layer) B4 to supply an acid containing chemical liquid, and a fifth block (freezing layer) B5 to form a protective film for protecting the resist pattern.

Second block (BCT layer) B2 includes an application module to apply a chemical liquid for forming the anti-reflection film using a spin-coating, a shelf unit constituting a group of processing modules of a heating and cooling system for treatments before and after a process performed by the application module, and a carrying arm A2 disposed between the application module and the processing modules to transfer wafer W between these modules. The shelf unit is arranged along the transfer region R1 in which carrying arm A1 moves, and is respectively configured by lamination of the modules of the heating and cooling system.

Third block (COT layer) B3 is configured similar to second block (BCT layer) B2, except that the application module applies a resist liquid as chemical acid. Fourth block (acid treating layer) B4 and fifth block (freezing layer) B5 are configured similar to the second block and the third block, respectively, except that the application module applies a chemical liquid for acid processing and forming protective film 76, respectively. The application module of COT layer B3 corresponds to the resist applying device, the application module of acid treating layer B4 corresponds to the acid treating device, and the application module of the freezing layer B5 corresponds to the chemical liquid supply device for forming the protective film. Further, the layout of the second to the fifth block B is configured similar to that of first block B1 (which will be described later) when viewed in a plan view.

In first block (DEV layer) B1, as shown in FIG. 16, developing modules 113 corresponding to the application module are laminated in two stages within one DEV layer B1, and shelf units U1~U4 are provided constituting a group of heating modules for processing the wafer before and after the developing module. The developing module corresponds to the developing apparatus of the embodiment as described earlier. And, the interior of DEV layer B1 is provided with carrying arm A1 to carry wafer W to developing modules 113 formed in two stages and the heating modules. That is, developing modules 113 formed in two stages share carrying arm A1.

Processing block C2 is further provided with a shelf unit U5 at a position that carrying arms A1~A5 of each block B1~B5 can access, as shown in FIG. 16 and FIG. 18. A transfer module TRS is provided in shelf unit U5 to transfer wafer W between carrying arms A1~A5 and the shelf unit. And, a carrying arm E1 capable of being elevated is provided near shelf unit U5, and can access to theses modules provided in shelf unit U5. Also, transfer arm 112 can elevate to access modules provided in a height position corresponding to BCT layer B2 and DEV layer B1.

Also, a shelf unit U6 is provided in processing block C2 in an area of carrying region R1 adjacent to interface block C3 with a position capable of being accessed by carrying arm A1 and shuttle arm 114 (which will be described later), as shown in FIG. 16. Further, shelf unit U6 includes transfer module TRS as in shelf unit U5.

In the upper part within DEV layer B1, a shuttle arm 114 is provided as a dedicated transfer means to carry wafer W from shelf unit U5 directly to shelf unit U6. Also, interface block C3 is provided with an interface arm 115 capable of carrying wafer W between each module of shelf unit U6 and exposing apparatus C4.

Applying and developing apparatus 110 includes a control unit 120 including, for example, a computer. Control unit 120 is constituted by program, memory and CPU, etc. The program stores commands (each step) for allowing to send a control signal from control unit 120 to each unit of applying and developing apparatus 110, to carry the wafer between modules (which will be described later) and to advance the processes in each module. The program may be stored in various storage medium used in control unit 1A as mentioned above to be installed in control unit 120.

Next, processing process by applying and developing apparatus 110 will be described. Firstly, a carrier C containing a plurality of wafers W is carried from the outside into mount table 111, and wafers W within carrier C are sequentially carried to transfer module TRS1 by transfer arm 112. Carrying arm A2 of second block (BCT layer) B2 receives wafer W from transfer module TRS1 to transfer the wafer W to the application module, so that an anti-reflection film 72 is formed on wafer W.

Thereafter, wafer W is sequentially transferred to the heating module and transfer module TRS2 of shelf unit U5 by carrying arm A2, and then, is transferred to transfer arm E1 and transfer module TRS3 in this order. And, wafer W is transferred by carrying arm A3 to the application module of COT layer B3 to form resist film 73. After formation of resist film 73, wafer W is transferred to heating module and transfer f4 of shelf unit U5 in this order by carrying arm A3, and then, is transferred to transfer unit 116 of shelf unit U5 by transfer arm E1, and is further transferred from the transfer unit to shuttle arm 114. Shuttle arm 114 transfers wafer W to transfer unit 117 of shelf unit U6, and then wafer W is transferred from the transfer unit to interface arm 115. Wafer W is transferred to exposing device C4 by interface arm 115 to be subjected to the first exposure process. FIG. 8(a) as described above illustrates wafer W after the first exposure process.

After the first exposure process is performed, wafer W is transferred to carrying arm A1 through transfer module TRS5 of shelf unit U6 by interface arm 115, and is transferred to heating module and developing module 113 in this order to be processed. FIG. 8(c) illustrates wafer W after the wafer W is developed in developing module 113. Wafer W is transferred by carrying arm A1 to heating module, transfer module TRS6, transfer arm E1 and transfer module TRS7 in this order. A carrying arm A4 of fourth block (acid treating layer) B4 receives wafer W from transfer module TRS7 to transfer the wafer W to application module, so that an acid chemical liquid is supplied to wafer W. FIG. 8(d) illustrates wafer supplied with the acid chemical liquid in such a manner. After acid chemical liquid is supplied, wafer W is transferred by carrying arm A4 to heating module to be heated therein. FIG. 8(e) illustrates wafer W after being heated.

After the heating, wafer W is transferred to transfer module TRS8 of shelf unit U5 by carrying arm A4, and then is transferred from the transfer module to transfer arm E1, shuttle arm 114, interface arm 115, transfer module TRS9, carrying arm A1 and developing module 113 in this order. Wafer is developed at the developing module, and the modified part is to be removed, as shown in FIG. 8(f). Thereafter, wafer W is transferred by carrying arm A1 to heating module, transfer module TRS10, transfer arm E1, transfer module TRS11 in this order. A carrying arm A5 of fifth block (freezing layer) B5 receives wafer W from transfer module TRS11 to transfer the wafer W to the application module, so that the chemical liquid is supplied to wafer W and reacts with the resist to form protective film 76, as shown in FIG. 9 (a).

Subsequently, wafer W is transferred by carrying arm A2 to heating module and transfer module TRS12 of shelf unit U5 in this order, and then is transferred to COT layer B3 through transfer module TRS3. And thereafter, wafer W is sequentially transferred to each module of each block B1~B4 and exposing device C4 in a path as described above, and is sequentially subjected to the resist application process in the application module of COT layer B3, the exposure process in exposing device C4, the developing process in developing module 113 of DEV layer B1, and acid treatment in acid treating layer B4 in this order. Thereafter, modified part 79 is removed by developing module 113 as shown in FIG. 10, and then wafer W is transferred to the heating module in DEV layer B1 and transfer module TRS7 in this order. Wafer W is then returned to carrier C by transfer arm 112.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus to develop a substrate formed with a resist film and exposed, by supplying a developing liquid to the substrate, comprising;
   a mount table configured to mount the substrate horizontally;
   a first supply line configured to supply the developing liquid regulated to a first temperature to a nozzle so that the developing liquid regulated to the first temperature is supplied to the surface of the substrate disposed on the mount table;
   a second supply line configured to supply the developing liquid regulated to a second temperature higher than the first temperature to the nozzle so that the developing liquid regulated to the second temperature is supplied to the surface of the substrate disposed on the mount table;
   at least one temperature regulating unit connected to an upstream side of the first supply line and the second supply line, and configured to regulate the temperature of the developing liquid; and
   a control unit configured to output a control signal which allows the first nozzle to supply the developing liquid regulated to the first temperature on the surface of the substrate so as to develop the surface of the substrate and then allows the nozzle to supply the developing liquid regulated to the second temperature on the surface of the substrate,
   wherein at least the first supply line is branched into a plurality of flow paths,
   wherein a temperature sensor is provided at an end portion of the nozzle where the downstream sides of the first supply line and the second supply line are joined together to output a control signal based on a detected temperature to control the flow rate of the developing liquid flowing in the first supply line regulated to the first temperature and the flow rate of the developing liquid flowing in the second supply line regulated to the second temperature,
   wherein the control unit includes a memory that stores in advance a mixing ratio of the developing liquid regulated to the first temperature and the developing liquid regulated to the second temperature corresponding to a difference between a detected temperature at the temperature sensor and a set temperature, and
   wherein the control unit is further configured to control the flow rate of the developing liquid regulated to the first temperature and the flow rate of the developing liquid regulated to the second temperature, when it is determined that the detected temperature and the set temperature are different from each other.

2. The apparatus according to claim 1, further comprising a cleaning nozzle configured to supply a cleaning liquid on the surface of the substrate disposed on the mount table, wherein the control unit outputs a control signal for allowing the cleaning nozzle to supply the cleaning liquid to the surface of the substrate after the substrate is developed by the first developing liquid, and then for allowing the second nozzle to supply the second developing liquid to the surface of the substrate.

3. The apparatus according to claim 1, further comprising:
   a join part at which the first supply line and the second supply line join;
   a flow rate regulating unit configured to regulate a flow ratio of the developing liquid between the first supply line and the second supply line; and
   a control unit which controls the flow rate regulating unit to regulate the temperature of the developing liquid into the second temperature so as to use the developing liquid at the second temperature at a downstream side of the join part.

4. The apparatus according to claim 1, wherein the first supply line and the second supply line share a nozzle body and the nozzle formed in the nozzle body, each of the first supply line and the second supply line is connected to the nozzle, and the control unit outputs a control signal to control the temperature of the developing liquid discharged from the nozzle in the first temperature when the developing liquid is supplied to the surface of the substrate through the first supply line, and to control the temperature of the developing liquid discharged from the nozzle in the second temperature when the developing liquid is supplied to the surface of the substrate through the second supply line.

5. The apparatus according to claim 1, wherein the nozzle is provided with a first developing liquid discharge port and a second developing liquid discharge port for discharging the developing liquid regulated in the first temperature and the developing liquid regulated in the second temperature, respectively.

6. The apparatus according to claim 1, wherein the control unit outputs a control signal for making a supply time of the developing liquid regulated at the second temperature longer than that of the first developing liquid regulated at the first temperature so as to maintain the temperature of the substrate surface at a relatively high temperature close to the second temperature.

7. The apparatus according to claim 1, further comprising a first regulator to regulate a flow rate of the developing liquid regulated in the first temperature and a second regulator to regulate a flow rate of the developing liquid regulated in the second temperature, wherein the control unit outputs a control signal for regulating each of the first and second regulators so that the flow rate of the developing liquid regulated in the second temperature becomes smaller than that of the first developing liquid regulated in the first temperature.

8. The apparatus according to claim 1, wherein a temperature sensor is provided at an end portion of the nozzle where the downstream sides of the first supply line and the second supply line are joined together to output a control signal based on a detected temperature to control the flow rate of the developing liquid flowing in the first supply line regulated in the first temperature and the flow rate of the developing liquid flowing in the second supply line regulated in the second temperature.

9. The apparatus according to claim 1, wherein the control unit is further configured to receive a signal from a temperature sensor that detects temperatures of the developing liquids, and control the flow rate of the developing liquids based on the signal from the temperature sensor.

* * * * *